(12) United States Patent
Hattori

(10) Patent No.: US 6,762,634 B1
(45) Date of Patent: Jul. 13, 2004

(54) DUAL-LOOP PLL WITH DAC OFFSET FOR FREQUENCY SHIFT WHILE MAINTAINING INPUT TRACKING

(75) Inventor: Hide Hattori, Palo Alto, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 10/604,730

(22) Filed: Aug. 13, 2003

(51) Int. Cl.[7] .................................................. H03L 7/06
(52) U.S. Cl. ................................... 327/159; 331/49
(58) Field of Search ................................ 327/145–150, 327/156–159; 331/11, 46, 49

(56) References Cited

U.S. PATENT DOCUMENTS

| | | | |
|---|---|---|---|
| 4,380,742 A | 4/1983 | Hart | 331/1 A |
| 4,516,084 A * | 5/1985 | Crowley | 331/2 |
| 4,528,523 A | 7/1985 | Crowley | 331/10 |
| 4,929,918 A | 5/1990 | Chung | 331/10 |
| 5,247,265 A | 9/1993 | Norimatsu | 331/16 |
| 5,351,015 A | 9/1994 | Masumoto | 331/1 R |
| 5,479,073 A | 12/1995 | Mamiya | 315/169.3 |
| 5,546,433 A | 8/1996 | Tran | 375/376 |
| 5,809,397 A * | 9/1998 | Harthcock et al. | 455/13.2 |
| 5,950,115 A * | 9/1999 | Momtaz et al. | 455/73 |
| 5,978,425 A | 11/1999 | Takla | 375/374 |
| 6,198,353 B1 | 3/2001 | Janesch et al. | 331/16 |
| 6,570,948 B1 * | 5/2003 | Marshall | 375/376 |
| 6,693,987 B1 * | 2/2004 | Hattori | 375/376 |

* cited by examiner

*Primary Examiner*—Timothy P. Callahan
*Assistant Examiner*—Cassandra Cox
(74) *Attorney, Agent, or Firm*—Stuart T. Auvinen

(57) ABSTRACT

A phase-locked loop (PLL) keeps tracking a reference clock when a frequency offset is introduced. The PLL has primary and secondary PLL loops. A digital-to-analog converter (DAC) generates a current that is passed through an offset resistor to generate an offset voltage. An op amp is inserted in the primary loop between a filter capacitor and a voltage-controlled oscillator (VCO). The offset resistor is coupled between the inverting input of the op amp and the op amp's output. When the DAC offset occurs, the voltage to the VCO and the frequency of the primary loop change and the primary loop loses tracking of the reference clock. The secondary loop keeps tracking the reference clock during the DAC offset while the primary loop is open. Then the output clock of the secondary loop is applied as the feedback clock to the phase comparator of the primary loop.

17 Claims, 3 Drawing Sheets

//...

DUAL-LOOP PLL WITH DAC OFFSET FOR FREQUENCY SHIFT WHILE MAINTAINING INPUT TRACKING

BACKGROUND OF INVENTION

This invention relates to phase-locked loops (PLL's), and more particularly to dual-loop PLLs with frequency shift.

Many electronic systems are synchronous or clocked. These systems may rely on accurate clocks to synchronize the timing of operations and data transfers. A crystal oscillator can be used to generate a clock at a base frequency, which is then divided or multiplied to create one ore more clocks with desired frequencies. External clock can be received and likewise divided or multiplied to produce internal clocks.

Clocks are typically generated from oscillator outputs using phase-locked loops (PLL's). PLLs are one of the most widely use building blocks in digital systems today. FIG. 1 illustrates a typical PLL. Phase detector 10 receives a reference-clock input from an external oscillator or clock source. The phase and frequency of the reference clock is compared to the phase and frequency of a feedback clock generated by voltage-controlled oscillator (VCO) 14. The feedback clock can be the output clock generated by the PLL, or a divided-down derivative of the output clock from VCO 14 such as produced by feedback counter 16.

Phase detector 10 outputs up and down signals UP, DN when the phase or frequency of one input does not match the phase or frequency of the other input. These up and down signals cause charge pump 12 to add or remove charge from filter capacitor 20, which integrates the charge. As charge is added or removed through resistor 21 from filter capacitor 20, the voltage input to VCO 14 is increased or decreased. VCO 14 responds by increasing or decreasing the frequency of the output clock. The feedback clock to phase detector 10 is likewise changed by VCO 14.

As charge pump 12 adds or removes charge from filter capacitor 20, altering control voltage VCTL input to VCO 14, the phase and frequency of the feedback clock are adjusted until the reference clock is matched. Then phase detector 10 stops generating up and down signals to charge pump 12, until charge leaks off filter capacitor 20 or the reference clock changes.

Pulses of short duration are often used for up and down signals UP, DN. For example, phase detector 10 can be a pair of simple flip-flops. One flip-flop outputs the UP pulse when clocked by the reference-clock input. The UP pulse ends when cleared by the feedback-clock input. The other flip-flop generates the DN pulse when clocked by the feedback-clock input. The DN pulse ends when cleared by the reference-clock input. As the phases match more closely, the duration of the pulses shorten.

Often both up and down signals are pulsed simultaneously when little or no phase adjustment is needed. Charge pump 12 should supply either no charge or equal up and down charges to filter capacitor 20 so that a net zero charge is supplied when the duration of simultaneous UP and DN pulses are identical.

Sometimes the frequency of the reference clock shifts over time, either intentionally or unintentionally. Intention frequency shifts may occur as line conditions change, such as when a communications channel experiences better conditions and can handle a higher bit rate for a period of time.

Since clocks are intended to be stable, such frequency shifts may be difficult to track. The PLL may lose sync or otherwise produce erroneous results. The net charge added to filter capacitor 20 may not exactly compensate for the frequency shift, resulting in a phase error. VCO 14 may responds by slightly changing the phase and frequency of the feedback clock so that it no longer exactly matches the reference clock.

FIG. 2 is a timing diagram of UP and DOWN inputs to a charge pump and the resulting control voltage to the VCO when the reference frequency is shifted. When the frequency of the input reference clock is shifted upward, a leading phase difference is detected by the phase detector, and an UP pulse is generated. The charge pump responds to the UP pulse by pumping positive charge to the filter capacitor, increasing the control voltage VCTL to the VCO. The amount of charge pumped to the filter capacitor depends on the duration of the UP pulse. Once the frequency shift ends, the UP pulse ends, and the control voltage remains stable. Down pulses DN may also be activated during the shift when the frequency shift is relatively slow.

Ideally, the net current of the UP and DN pulses should match the frequency shift. The net charge added to the control voltage should exactly match the new frequency. This net charge added by the charge pump shifts the frequency of the VCO.

What is desired is a PLL that can smoothly respond to a shift in the input frequency. A PLL that can have a frequency offset is desirable. A frequency-shifting PLL is desirable.

DETAILED DESCRIPTION

The present invention relates to an improvement in phase-locked loops (PLL's). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
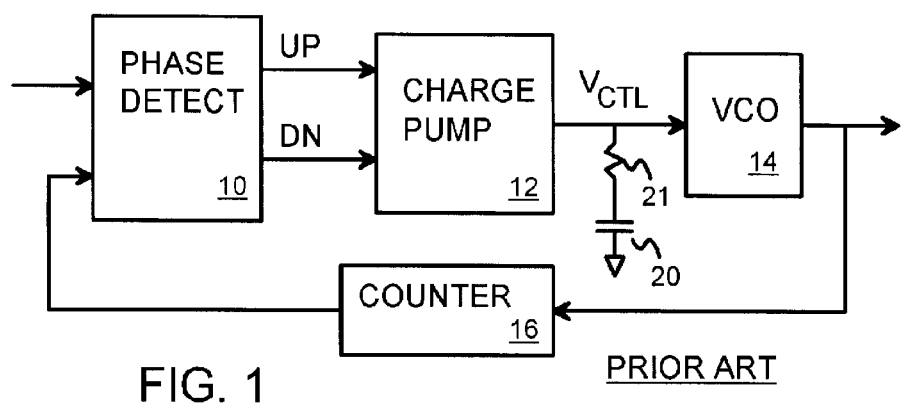
FIG. 1 illustrates a typical PLL.
Figure 2:
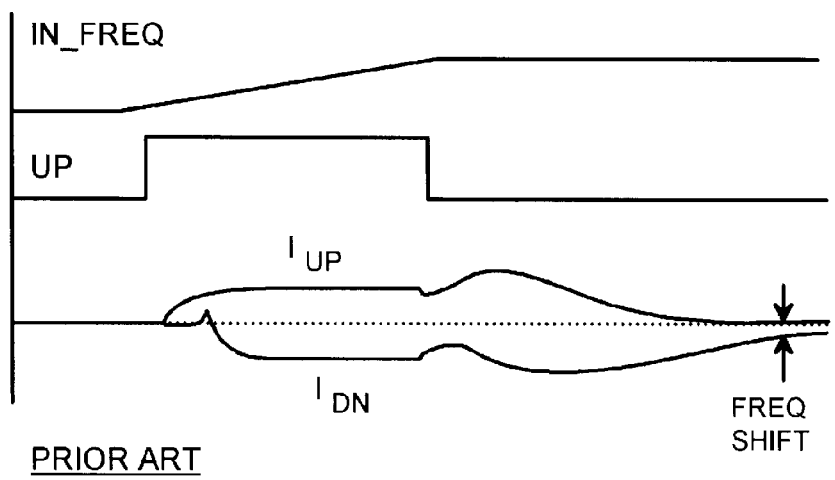
FIG. 2 is a timing diagram of UP and DOWN inputs to a charge pump and the resulting control voltage to the VCO when the reference frequency is shifted.
Figure 3:
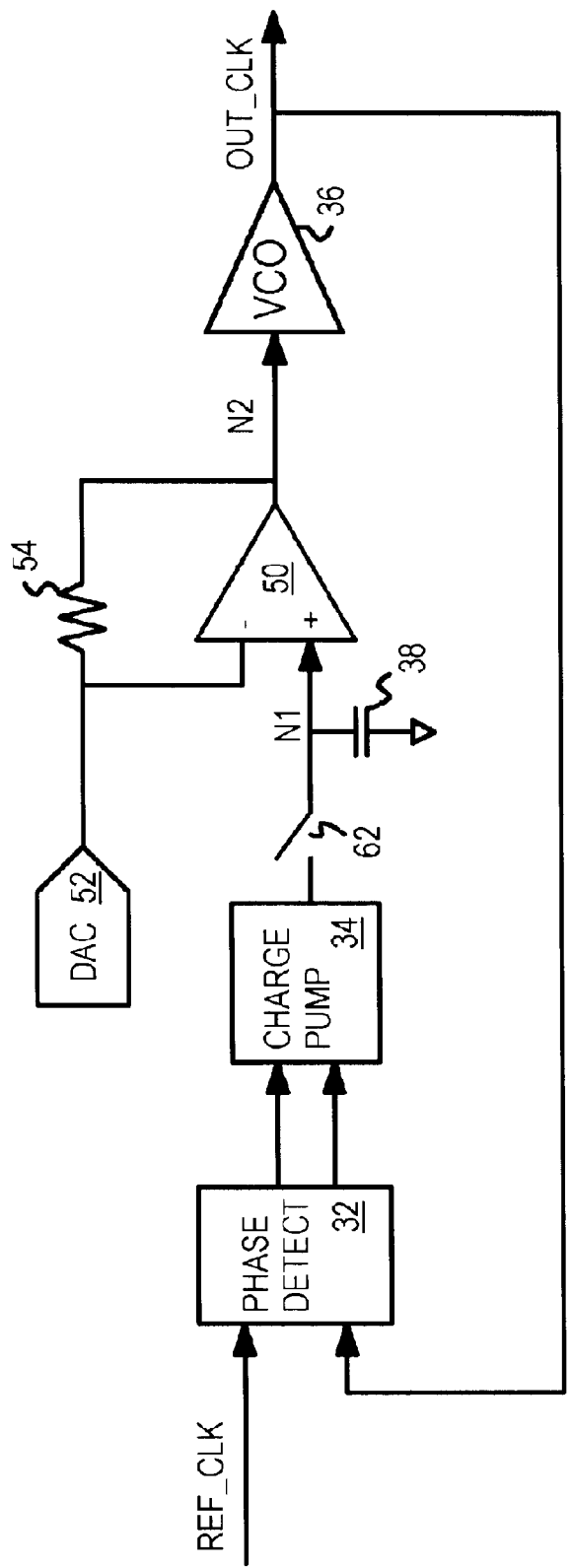
FIG. 3 is a block diagram of a single-loop PLL with a DAC for frequency shifting.

FIG. 3 is a block diagram of a single-loop PLL with a DAC for frequency shifting. Phase detector 32 compares the phase of reference clock REF_CLK to the output clock OUT_CLK (or another feedback clock). Phase differences activate charge pump 34 to charge or discharge filter capacitor 38. As the voltage on filter capacitor 38 changes, op amp 50 transmits these voltage changes on node N1 to node N2, the input to voltage-controlled oscillator VCO 36, adjusting the frequency of output clock OUT_CLK.

The output from digital-to-analog converter DAC 52 is normally turned off, so no current flows from DAC 52 through resistor 54. Then op amp 50 replicates its non-inverting input from node N1, the voltage of filter capacitor 38, to its output, node N2.

When a frequency shift is desired, switch 62 opens to disconnect charge pump 34 from filter capacitor 38. Node N1 is isolated and remains at a constant voltage except for leakage over a very long period of time. DAC 52 turns on and drives a current through resistor 54. The amount of the current depends on the digital value input to DAC 52. The current through resistor 54 produces a voltage difference between the output and inverting input of op amp 50.

The voltage offset across resistor 54 increases or decreases the voltage of node N2, the VCO input, relative to the filter voltage on node N1, depending on whether the current is positive or negative from DAC 52. Thus the frequency generated by VCO 36 can be increased or decreased by DAC 52.

Once the desired frequency has been reached by VCO 36, switch 62 can be opened and phase detector 32 causes the shifted-frequency output clock OUT_CLK to stop tracking the reference clock REF_CLK with the added offset from resistor 54. DAC 52 can be kept on to maintain the offset on resistor 54.

Figure 4:
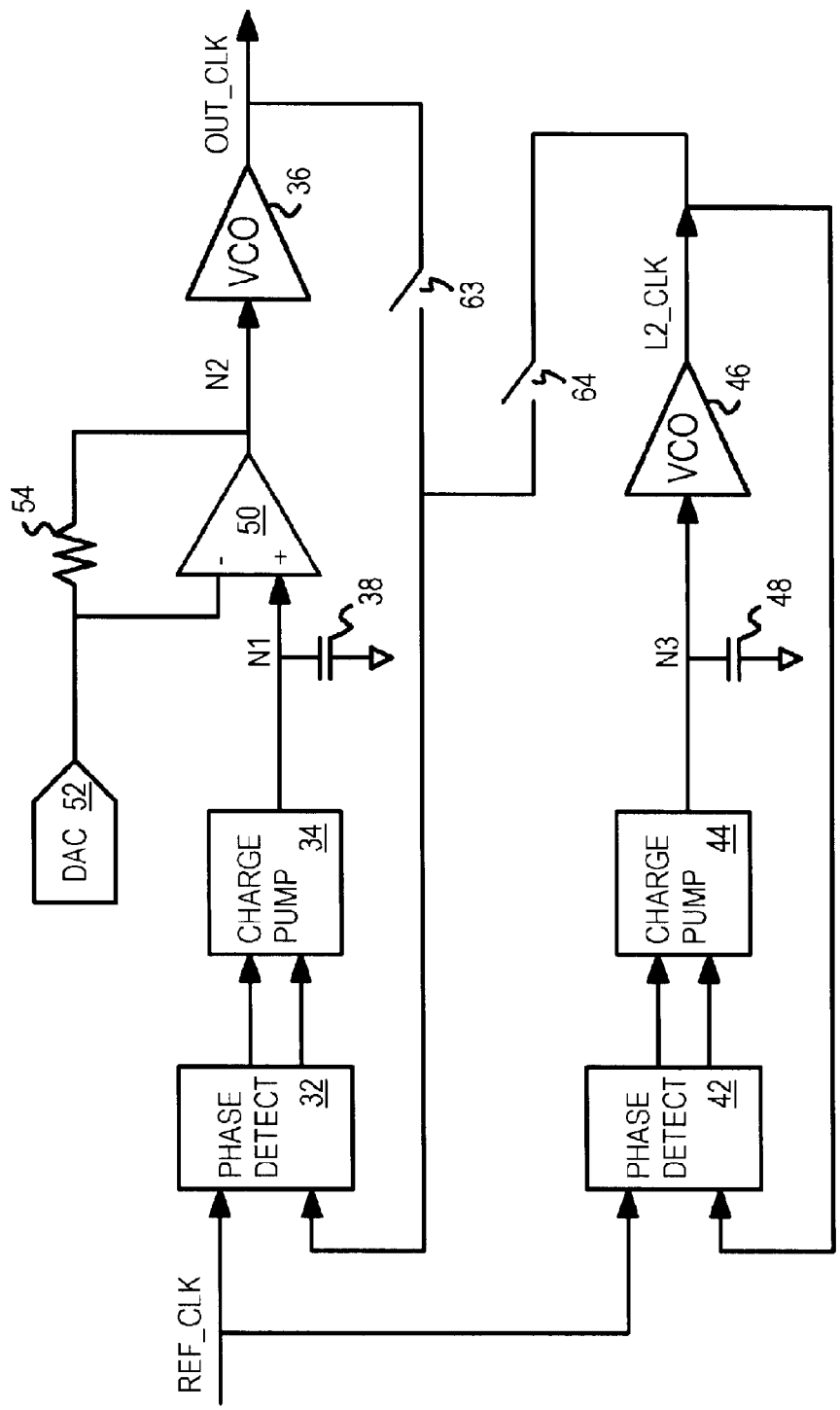
FIG. 4 shows a dual-loop PLL with frequency offset controlled by a DAC.

FIG. 4 shows a dual-loop PLL with frequency offset controlled by a DAC. A second tracking loop of phase detector 42, charge pump 44, filter capacitor 48 on node N3 to VCO 46 cause a second clock L2_CLK to track reference clock REF_CLK. This second loop is isolated from the primary loop by switch 64. When DAC 52 initiates a frequency shift, switch 63 opens to isolate OUT_CLK from phase detector 32. Switch 64 closes, allowing the second loop to continue tracking the input reference clock as the frequency shift occurs.

In the primary loop, phase detector 32 compares the phase of reference clock REF_CLK to the output clock L2_CLK of the secondary loop (or another feedback clock such as from a divider). Phase differences activate charge pump 34 to charge or discharge filter capacitor 38. As the voltage on filter capacitor 38 changes, op amp 50 transmits these voltage changes on node N1 to node N2, the input to voltage-controlled oscillator VCO 36, adjusting the frequency of output clock OUT_CLK.

The output from digital-to-analog converter DAC 52 is normally turned off, so no current flows from DAC 52 through resistor 54. Then op amp 50 replicates its non-inverting input from node N1, the voltage of filter capacitor 38, to its output, node N2.

When a frequency shift is desired, switch 63 opens to disconnect OUT_CLK from phase detector 32. Also switch 64 closes to connect the second loop and the primary loop. DAC 52 turns on and drives a current through resistor 54. The amount of the current depends on the digital value input to DAC 52.

The current through resistor 54 produces a voltage difference between the output and inverting input of op amp 50. The voltage offset across resistor 54 increases or decreases the voltage of node N2, the VCO input, relative to the filter voltage on node N1, depending on whether the current is positive or negative from DAC 52. Thus the frequency generated by VCO 36 can be increased or decreased by DAC 52.

Any tracking changes due to changes in reference clock REF_CLK that occurred while DAC 52 was shifting the frequency are captured by the second loop as the second loop's output L2_CLK follows changes of input REF_CLK. At the same time, phase detector 32 detects any phase differences between REF_CLK and L2_CLK and feeds an error signal into node N1 of the primary loop. Any such voltage change is thus coupled to node N1 of the primary loop when switch 64 is closed.

Phase detector 32 in the primary loop causes the shifted-frequency output clock OUT_CLK to continue tracking the reference clock REF_CLK with the added offset from resistor 54. Phase detector 32 keeps track of errors between REF_CLK and L2_CLK for every cycle.

The voltage offset across resistor 54 is maintained by op amp 50, causing nodes N1 and N2 to have different voltages, and causing OUT_CLK and REF_CLK to have differing frequencies with a difference in frequency determined by the voltage offset. As reference clock REF_CLK changes in phase or frequency, these input-clock changes continue to adjust the output clock, but the output clock continues to be offset in frequency by the amount determined by the voltage offset across resistor 54.

ALTERNATE EMBODIMENTS

Several other embodiments are contemplated by the inventor. For example the charge pump, phase comparator, VCO, switches, and DAC can be implemented by a variety of circuits and technologies. Other filters can be substituted for capacitors 38, 48, such as filters with inductances, series resistances, or parallel legs. Additional PLL loops can be added, and more complex circuits can be substituted. Feedback counters may added or simply divide by one rather than a larger divisor. Other rectifier circuits could be used in place of the diode. Coupling of nodes can be through capacitors or resistors. The DAC can be implemented in a variety of technologies and circuits and may include current-sources of various steps, switched-capacitor, and other techniques.

The current from the DAC can be slowly ramped or stepped by sequencing the DAC input through intermediate digital values rather than initially applying the final value. The exact frequency offset can be determined empirically or by simulation, and may be adjusted by trimming the DAC or resistor value. Trimming may be done by adjusting the digital value used for the desired frequency shift.

The switch after the VCO may be a disable logic control input to the phase detector rather than a discrete switch. Switches may also be implemented as transmission gates of pass transistors. The op amp can be a standard operational amplifier implemented with any of a variety of circuits.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended thah the scope of the invention be limited not by this detailed description, but rather by the claims appended hereto.

What is claimed is:

1. An offsetting phase-locked loop (PLL) comprising:
   a primary phase comparator, receiving a reference clock and a primary feedback clock;
   a primary filter capacitor for generating a primary filter voltage;
   a primary charge pump, activated by phase differences detected by the primary phase comparator, for charging and discharging the primary filter capacitor;
   a primary voltage-controlled oscillator (VCO) for generating a primary output clock having an output frequency that is a function of a primary VCO input voltage of a primary VCO input;
   an op amp having a first input receiving the primary filter voltage, and an output driving the primary VCO input;
   an offset resistor, coupled between the primary VCO input and a second input to the op amp;
   a digital-to-analog converter (DAC) receiving a digital value, for generating a DAC current as a function of the digital value, the DAC current being driven through the offset resistor;
   a secondary phase comparator, receiving the reference clock and a secondary feedback clock;
   a secondary filter capacitor for generating a secondary filter voltage;
   a secondary charge pump, activated by phase differences detected by the secondary phase comparator, for charging and discharging the secondary filter capacitor;
   a secondary voltage-controlled oscillator (VCO) for generating a secondary output clock having an output frequency that is a function of the secondary filter voltage; and
   a coupling switch, between the secondary VCO and the primary phase comparator, for coupling the secondary output clock to the primary feedback clock after the DAC generates the DAC current,
   whereby the DAC generates the DAC current to offset a voltage of the primary VCO input.

2. The offsetting phase-locked loop of claim 1 wherein the primary output clock or a derivative of the primary output clock is fed back to the primary phase comparator as the primary feedback clock;
   wherein the secondary output clock or a derivative of the secondary output clock is fed back to the secondary phase comparator as the secondary feedback clock.

3. The offsetting phase-locked loop of claim 2 further comprising:
   a primary switch, coupled between the primary output clock and the primary feedback clock, for disconnecting the primary output clock from the primary feedback clock.

4. The offsetting phase-locked loop of claim 3 wherein primary switch opens, disconnecting the primary VCO from the primary phase comparator, when the DAC initially generates the DAC current.

5. The offsetting phase-locked loop of claim 4 wherein the coupling switch opens, disconnecting the secondary VCO from the primary phase comparator, when the DAC initially generates the DAC current.

6. The offsetting phase-locked loop of claim 2 wherein the first input to the op amp is a non-inverting input and the second input to the op amp is an inverting input.

7. The offsetting phase-locked loop of claim 2 wherein the primary output clock is the primary feedback clock or is a multiple of the primary feedback clock.

8. The offsetting phase-locked loop of claim 2 further comprising:
   a primary feedback divider between the primary output clock and the primary feedback clock;
   wherein the primary output clock is a multiple of the primary feedback clock.

9. A dual-loop phase-locked loop (PLL) comprising:
   a first loop that comprises:
   a first phase comparator that receives a reference clock and a first feedback clock;
   a first filter capacitor on a first filter node;
   a first charge pump, coupled to the first phase comparator and to the first filter node, for charging and discharging the first filter capacitor;
   a first oscillator for generating a first output clock in response to a first control node;
   wherein the first output clock or a derivative is fed back to the first phase comparator as the first feedback clock;
   a digital-to-analog converter (DAC) receiving a digital value and outputting an analog voltage generated in response to the digital value;
   an op amp, coupled between the first filter node and the first control node;
   a resistor coupled to receive the analog voltage from the DAC, the resistor coupled between a second input of the op amp and the first control node;
   a second loop that comprises:
   a second phase comparator that receives the reference clock and a second feedback clock;
   a second filter capacitor on a second filter node;
   a second charge pump, coupled to the second phase comparator and to the second filter node, for charging and discharging the second filter capacitor;
   a second oscillator for generating a second output clock in response to the second filter node;
   wherein the second output clock or a derivative is fed back to the second phase comparator as the second feedback clock; and
   a coupling switch coupled between the second oscillator and the first phase comparator.

10. The dual-loop phase-locked loop of claim 9 further comprising:
    an isolating switch for disconnecting the first oscillator from the first phase comparator.

11. The dual-loop phase-locked loop of claim 10 wherein the coupling switch is closed to connect the second loop to the first loop when the digital value to the DAC changes.

12. The dual-loop phase-locked loop of claim 11 wherein the second input to the op amp is an inverting input, the op amp having a non-inverting input coupled to the first filter node and an output driving the first control node.

13. The dual-loop phase-locked loop of claim 12 wherein a frequency of the first output clock is a function of a voltage of the first control node;
    wherein a frequency of the second output clock is a function of a voltage of the second filter node,
    wherein the first and second oscillator are voltage-controlled oscillators (VCOs).

14. A reference-tracking and frequency-offsetting clock generator comprising:

first phase comparator means, receiving a reference clock and a first feedback clock, for comparing phases of the reference clock and the first feedback clock;

first filter capacitor means, on a first filter node, for storing charge;

first charge pump means, coupled to the first phase comparator means and to the first filter node, for charging and discharging the first filter capacitor means;

first oscillator means for generating a first output clock in response to a first control node;

first feedback means, receiving the first output clock, for feeding back the first output clock or a derivative to the first phase comparator means as the first feedback clock;

digital-to-analog converter DAC means, receiving a digital value, for converting the digital value to an analog current;

op amp means, coupled between the first filter node and the first control node, for driving the first control node in response to a difference between a first input and a second input, the first input coupled to the first filter node;

resistor means, coupled between the second input of the op amp means and the first control node, for generating an offset voltage across the op amp means in response to the analog current from the DAC means;

wherein the offset voltage is a voltage difference between the first filter node and the first control node that results in a frequency offset of the first output clock;

second phase comparator means, receiving the reference clock and a second feedback clock, for comparing phases of the reference clock and the second feedback clock;

second filter capacitor means, on a second filter node, for storing charge; second charge pump means, coupled to the second phase comparator means and to the second filter node, for charging and discharging the second filter capacitor means;

second oscillator means for generating a second output clock in response to the second filter node; second feedback means, receiving the second output clock, for feeding back the second output clock or a derivative to the second phase comparator means as the second feedback clock; and coupling means, between the first feedback clock and the second output clock, for connecting the second output clock to the first feedback clock to the first phase comparator means when the DAC means adjusts the analog current in response to changes in the digital value.

15. The reference-tracking and frequency-offsetting clock generator of claim 14 further comprising:

isolating switch means for disconnecting the first oscillator means from the first phase comparator means when the digital value is applied to the DAC means.

16. The reference-tracking and frequency-offsetting clock generator of claim 14 wherein the coupling means further comprises:

switch means for applying the second output clock as the first feedback clock to the first phase comparator means after the DAC means has adjusted the analog current;

wherein second output clock adjusts a frequency of the first output clock to account for changes to the reference clock during a time when the DAC means adjusted the analog current.

17. The reference-tracking and frequency-offsetting clock generator of claim 14 wherein the second input to the op amp means is an inverting input, and the first input to the op amp means is a non-inverting input.

* * * * *